United States Patent
Cheng

(10) Patent No.: US 11,923,023 B2
(45) Date of Patent: Mar. 5, 2024

(54) DEBUG CAPABILITIES OF A MEMORY SYSTEM WITH A PIN

(71) Applicant: Micron Technology, Inc., Boise, ID (US)

(72) Inventor: Jingwei Cheng, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/982,912

(22) PCT Filed: Aug. 31, 2020

(86) PCT No.: PCT/CN2020/112577
§ 371 (c)(1),
(2) Date: Sep. 21, 2020

(87) PCT Pub. No.: WO2022/041216
PCT Pub. Date: Mar. 3, 2022

(65) Prior Publication Data
US 2023/0207035 A1 Jun. 29, 2023

(51) Int. Cl.
*G11C 16/04* (2006.01)
*G11C 29/12* (2006.01)
*G11C 29/44* (2006.01)

(52) U.S. Cl.
CPC .... *G11C 29/1201* (2013.01); *G11C 29/12015* (2013.01); *G11C 29/44* (2013.01)

(58) Field of Classification Search
CPC .......... G11C 29/1201; G11C 29/12015; G11C 29/44
See application file for complete search history.

(56) References Cited

U.S. PATENT DOCUMENTS 8,488,356 B2 * 7/2013 Cheng ................. G06F 13/1668
365/63
10,942,657 B2 * 3/2021 Rowley ................. G06F 1/3225
(Continued)

FOREIGN PATENT DOCUMENTS

CN 111258842 A 6/2020

OTHER PUBLICATIONS

ISA/KR, International Search Report and Written Opinion of the International Searching Authority, Int'l Appl. No. PCT/CN2020/112577, dated May 26, 2021, Korean Intellectual Property Office, Seo-gu, Daejeon, Republic of Korea, 9pgs.

*Primary Examiner* — Pho M Luu
(74) *Attorney, Agent, or Firm* — Holland & Hart LLP

(57) ABSTRACT

Methods, systems, and devices for debug capabilities of a memory system with a pin are described. An apparatus may include a memory system that includes a plurality of pins of a first type that are configured to communicate information as part of operating the memory system and a pin of a second type. The apparatus may also include a circuit coupled with the memory system, the circuit including a resistor that is coupled with the pin of the second type. The memory system may include a controller that selects a value for the resistor and generates a code as part of a memory management operation to determine one or more operating conditions of the memory system based on selecting the value. The memory system controller may also determine an error associated with the code based on generating the code and the selected value of the resistor.

25 Claims, 5 Drawing Sheets

(56) References Cited

U.S. PATENT DOCUMENTS

| | | |
|---|---|---|
| 2012/0030153 A1 | 2/2012 | Yoon |
| 2013/0054902 A1* | 2/2013 | Biswas ............... G06F 13/1668 |
| | | 711/E12.001 |
| 2018/0005686 A1 | 1/2018 | Oh et al. |
| 2018/0046541 A1 | 2/2018 | Niu et al. |
| 2018/0101424 A1 | 4/2018 | Lim et al. |

* cited by examiner

DEBUG CAPABILITIES OF A MEMORY SYSTEM WITH A PIN

CROSS REFERENCE

The present Application for Patent is a 371 national phase filing of International Patent Application No. PCT/CN2020/112577 by CHENG et al., entitled "DEBUG CAPABILITIES OF A MEMORY SYSTEM WITH A PIN," filed Aug. 31, 2020, assigned to the assignee hereof, and expressly incorporated by reference herein.

BACKGROUND

The following relates generally to one or more systems for memory and more specifically to debug capabilities of a memory system with a pin.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
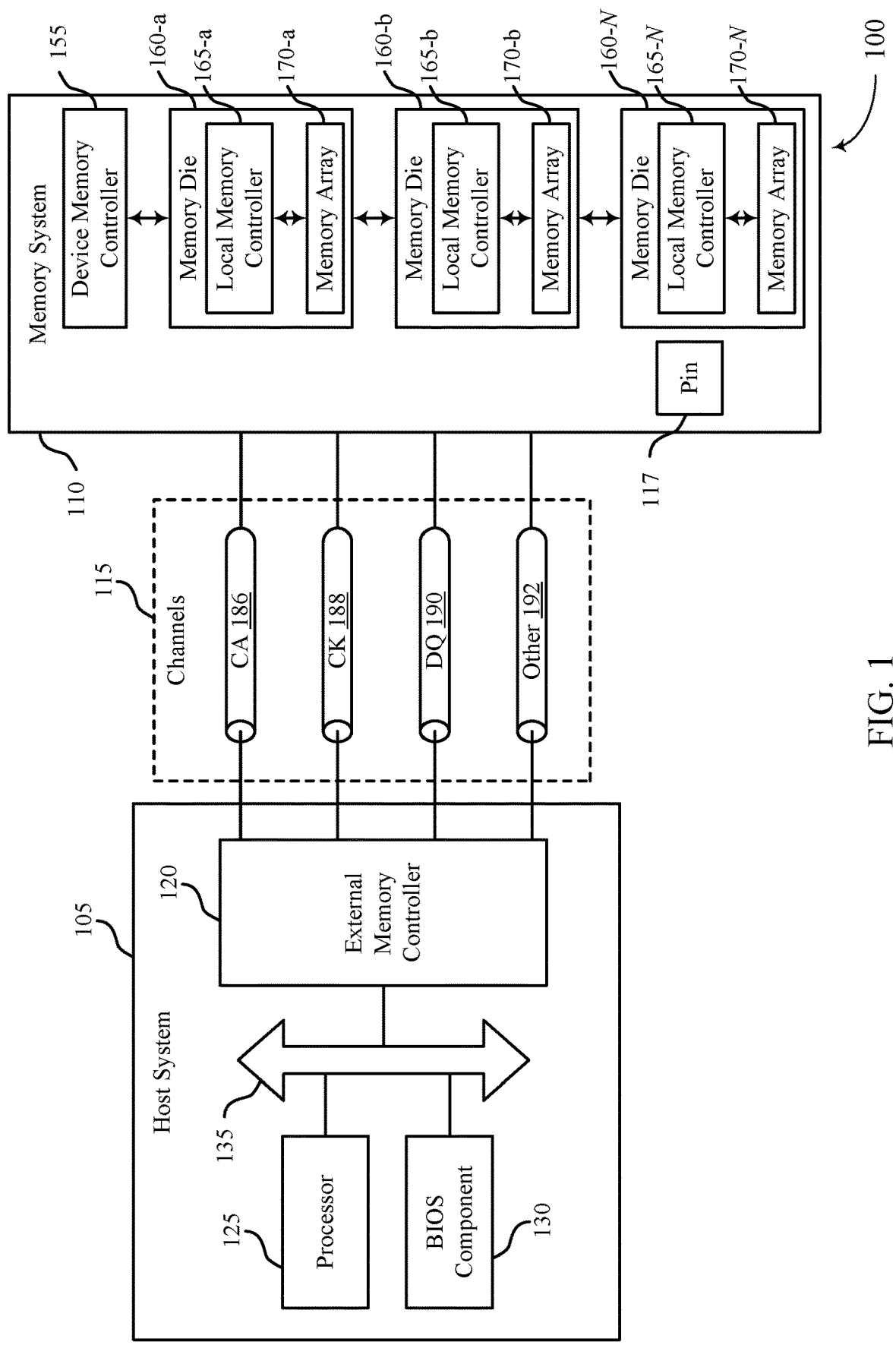
FIG. 1 illustrates an example of a system that supports debug capabilities of a memory system with a pin in accordance with examples as disclosed herein.

A system may include a memory system and a host system coupled with the memory system via a substrate. In some examples, the memory system may communicate signals and commands with the host system to perform access operations (e.g., read, write, and refresh operations). For example, the memory system may communicate the signals over one or more command and address (CA) channels or one or more data (DQ) channels. In some examples, a user of the memory system may initiate a debug operation to determine the integrity and timing of the signals over the channels and determine errors associated with the memory system. For example, the memory system may implement a test interposer to determine the integrity and timing of the signals. In some cases, as the speed at which the signals are communicated increases, the test interposer may impact the system and may cause invalid results for the debug operation. In other examples, the test interposer may cause at least some of the signals to be distorted due to the distance between the memory system and the host system. Additionally or alternatively, the user of the memory system may be unable to adjust timing parameters associated with the signals when implementing the test interposer. In some cases, a test mode may help adjust the timing parameters, but the user may also be unable to initiate a test mode at the memory system. Thus, debugging the memory system may be challenging when implementing a test interposer.

Systems, devices, and techniques are described herein for implementing a circuit that is coupled between the memory device and the substrate during a debug operation to determine errors associated with the memory system. For example, the circuit may include a resistor that is coupled with the memory system via a reserved for future use (RFU) pin (e.g., a pin of a second type). In some examples, the memory system may select a value for the resistor to generate code that may determine the error associated with the memory system. That is, the code may be generated as part of a memory management operation (the debug operation) to determine one or more operating conditions of the memory system. For example, generating the code may enable the memory system to adjust timing parameters associated with signals (e.g., CA and DQ signals) and to determine the timing and integrity of the signals. In some examples, the circuit may have a negligible impact on the system even when the signal speeds are relatively high. Thus, it may be able to determine the errors associated with the system more reliably and accurately. Examples of systems that may use the circuit to test for one or more errors may include memory systems associated vehicle or automotive systems.

Features of the disclosure are initially described in the context of systems and dies as described with reference to FIG. 1. Features of the disclosure are described in the context systems as described with reference to FIGS. 2 and 3. These and other features of the disclosure are further illustrated by and described with reference to an apparatus diagram and a flowchart that relate to debug capabilities of a memory system with a pin as described with reference to FIGS. 4 and 5.

FIG. 1 illustrates an example of a system 100 that supports debug capabilities of a memory system with a pin in accordance with examples as disclosed herein. The system 100 may include a host system 105, a memory system 110, and a plurality of channels 115 coupling the host system 105 with the memory system 110. The system 100 may include one or more memory systems 110, but aspects of the one or more memory systems 110 may be described in the context of a single memory system (e.g., memory system 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory system 110 may be a component of the system operable to store data for one or more other components of the system 100.

At least portions of the system 100 may be examples of the host system 105. The host system 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host system 105 may refer to the hardware, firmware, software, or a combination thereof that implements the functions of an external memory controller 120. In some examples, the external memory controller 120 may be referred to as a host or a host system 105.

A memory system 110 may be an independent device or a component that is operable to provide physical memory addresses/space that may be used or referenced by the system 100. In some examples, a memory system 110 may be configurable to work with one or more different types of host systems. Signaling between the host system 105 and the memory system 110 may be operable to support one or more of: modulation schemes to modulate the signals, various pin configurations for communicating the signals, various form factors for physical packaging of the host system 105 and the memory system 110, clock signaling and synchronization between the host system 105 and the memory system 110, timing conventions, or other factors.

The memory system 110 may be operable to store data for the components of the host system 105. In some examples, the memory system 110 may act as a slave-type device to the host system 105 (e.g., responding to and executing commands provided by the host system 105 through the external memory controller 120). Such commands may include one or more of a write command for a write operation, a read command for a read operation, a refresh command for a refresh operation, or other commands.

The host system 105 may include one or more of an external memory controller 120, a processor 125, a basic input/output system (BIOS) component 130, or other components such as one or more peripheral components or one or more input/output controllers. The components of host system 105 may be coupled with one another using a bus 135.

The processor 125 may be operable to provide control or other functionality for at least portions of the system 100 or at least portions of the host system 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host system 105. The BIOS component 130 may also manage data flow between the processor 125 and the various components of the system 100 or the host system 105. The BIOS component 130 may include a program or software stored in one or more of read-only memory (ROM), flash memory, or other non-volatile memory.

The memory system 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory system 110 including two or more memory dies may be referred to as a multi-die memory or a multi-die package or a multi-chip memory or a multi-chip package.

The device memory controller 155 may include circuits, logic, or components operable to control operation of the memory system 110. The device memory controller 155 may include the hardware, the firmware, or the instructions that enable the memory system 110 to perform various operations and may be operable to receive, transmit, or execute commands, data, or control information related to the components of the memory system 110. The device memory controller 155 may be operable to communicate with one or more of the external memory controller 120, the one or more memory dies 160, or the processor 125. In some examples, the device memory controller 155 may control operation of the memory system 110 described herein in conjunction with the local memory controller 165 of the memory die 160.

In some examples, the memory system 110 may receive data or commands or both from the host system 105. For example, the memory system 110 may receive a write command indicating that the memory system 110 is to store data for the host system 105 or a read command indicating that the memory system 110 is to provide data stored in a memory die 160 to the host system 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory system 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host system 105 (e.g., the processor 125) and the memory system 110. The external memory controller 120 may convert or translate communications exchanged between the components of the host system 105 and the memory system 110. In some examples, the external memory controller 120 or other component of the system 100 or the host system 105, or its functions described herein, may be implemented by the processor 125. For example, the external memory controller 120 may be hardware, firmware, or software, or some combination thereof implemented by the processor 125 or other component of the system 100 or the host system 105. Although the external memory controller 120 is depicted as being external to the memory system 110, in some examples, the external memory controller 120, or its functions described herein, may be implemented by one or more components of a memory system 110 (e.g., a device memory controller 155, a local memory controller 165) or vice versa.

The components of the host system 105 may exchange information with the memory system 110 using one or more channels 115. The channels 115 may be operable to support communications between the external memory controller 120 and the memory system 110. Each channel 115 may be examples of transmission mediums that carry information between the host system 105 and the memory system. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins of a first type or pads at the host system 105 and one or more pins of a first type or pads at the memory system 110. A pin of a first type may be an example of a conductive input or output point of a device of the system 100, and a pin of the first type may be operable to act as part of a channel.

In some examples, the memory system 110 may also include one or more pins. Some pins (e.g., pins of a first type) may couple with the channels 115 and may be used to operate the memory system 110. Pin 117 of a second type may not be coupled with channels 115. In some cases, the pin 117 may also be referred to as a reserved for future use (RFU) pin. In some cases, the pin 117 may be an example of a pin that is used during manufacturing or during testing, but may not be used during operation of the memory system for user data. That is, the pin 117 may be unused during normal operations of the memory system 110 (e.g., when performing access operations). In some examples, the pin 117 may be a pin at which neither the host system 105 nor the memory system 110 utilize to communicate with each other. In some examples, a user of a memory system 110 may utilize the pin 117 for testing operations or for other miscellaneous operations. As described herein, the pin 117 may be utilized during a debug operation.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, the CK channels 188 or DQ channels 190 may also be configured to communicate strobe (DQS) signals—e.g. a differential "busted clock" that may be sent during a read or write operation. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host system 105 and the memory system 110 including control information associated with the commands (e.g., address information). For example, commands carried by the CA channel 186 may include a read command with an address of the desired data. In some examples, a CA channel 186 may include any number of signal paths to decode one or more of address or command data (e.g., eight or nine signal paths).

In some examples, clock signal channels 188 may be operable to communicate one or more clock signals between the host system 105 and the memory system 110. Each clock signal may be operable to oscillate between a high state and a low state, and may support coordination (e.g., in time) between actions of the host system 105 and the memory system 110. In some examples, the clock signal may be single ended. In some examples, the clock signal may provide a timing reference for command and addressing operations for the memory system 110, or other system-wide operations for the memory system 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host system 105 and the memory system 110. For example, the data channels 190 may communicate information (e.g., bi-directional) to be written to the memory system 110 or information read from the memory system 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the memory system 110 may experience an error—e.g., an error associated with communicating signals over the channels 115 between the host system 105 and the memory system 110. In some cases, to determine the error or the timing and integrity of the signals communicated, the system 100 may utilize a test interposer. In some examples, as the memory system 110 increases a speed at which the signals are communicated over the channels, the test interposer may cause an impact on the system 100 that distorts the signals and causes invalid test data results. Additionally, the memory system 110 may be unable to adjust any timing parameters associated with the signals communicated without additional components. As a result, determining a cause of the error associated with the memory system 110 with a confidence level in the results may be difficult.

As described herein, the memory system 110 may be coupled with a circuit configured to debug the memory system 110 and determine errors associated with the memory system 110. For example, the circuit may include a resistor that is coupled with the pin 117. As the resistor is coupled with the pin 117, the impact of the circuit on the system 100 may be negligible. The memory system 110 may select the value of the resistor to generate a code to determine the error associated with the memory system. For example, the memory system 110 may generate the code to adjust the adjust the timing parameters associated with the signals communicated. That is, the resistor may be variable and by selecting different values, the memory system 110 may adjust timing parameters. Thus, a user of the memory system 110 may be able to accurately determine errors associated with the memory system 110—e.g., errors associated with the timing and integrity of the signals communicated.

The system 100 may include any quantity of non-transitory computer readable media that support techniques for debug capabilities of a memory system with a pin. For example, the host system 105, the memory system 110, device memory controller 155 may include or otherwise may access one or more non-transitory computer readable media storing instructions (e.g., firmware) for performing the functions ascribed herein to the host system 105, the memory system 110, device memory controller 155. For example, such instructions, when executed by the host system 105, the memory system 110, device memory controller 155, may cause the host system 105, the memory system 110, device memory controller 155 to perform associated functions as described herein.

Figure 2:
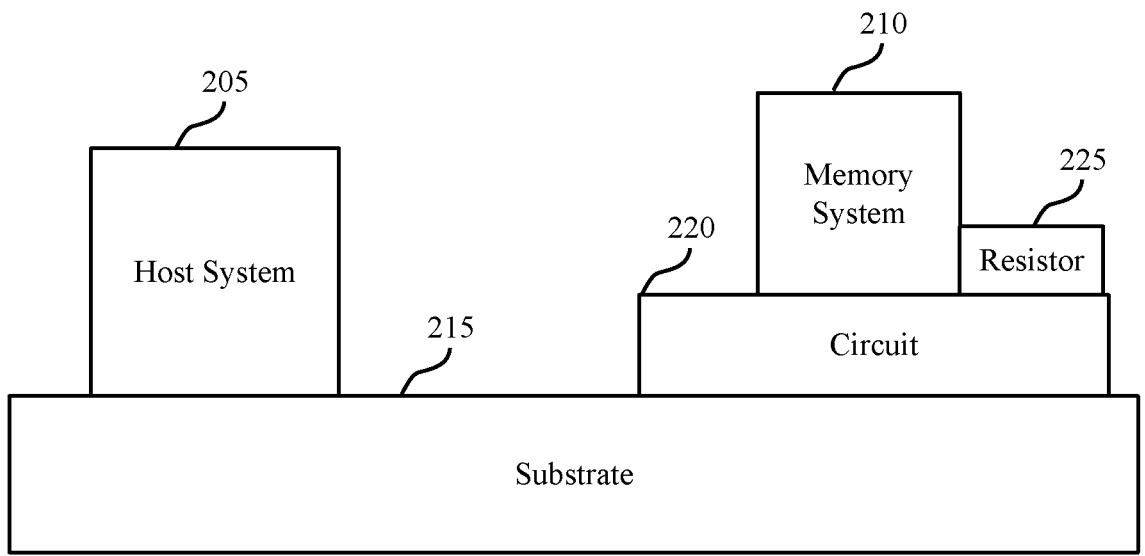
FIG. 2 illustrates an example of a system that supports debug capabilities of a memory system with a pin in accordance with examples as disclosed herein.

FIG. 2 illustrates an example of a system 200 that supports debug capabilities of a memory system with a pin in accordance with examples as disclosed herein. System 200 may include a host system 205 coupled with a substrate 215. The host system 205 may be an example of host system 105 as described with reference to FIG. 1. The system 200 may also include a circuit 220 coupled with the substrate 215 and the memory system 210. Memory system 210 may be an example of memory system 110 as described with reference to FIG. 1. The circuit 220 may also further include a resistor 225. In some cases, the methods as disclosed herein may be performed during a debug operation of the memory system 210. A user of the memory system 210 may initiate the debug operation.

The host system 205 may be configured to communicate signals (e.g., commands (CA signals) or data (DQ signals)) with the memory system 210 via the substrate 215. In some examples, the host system 205 may be configured to adjust the timing associated with the signals. That is, the host system 205 may increase or decrease a timing parameter associated with each signal that is communicated between the host system 205 and the memory system 210.

The memory system 210 may be configured to receive command signals from the host system 205. In some examples, the memory system 210 may be configured to receive data from or send data to the host system 205. The memory system 210 may also include a plurality of pins of a first type that are configured to couple with channels (e.g., channels 115 as described with reference to FIG. 1) between the memory system 210 and the host system 205. That is, the pins of the first type may be configured to communicate the signals between memory system 210 and the host system 205. In some examples, the memory system 210 may be unable to adjust the timing parameters associated with the signals. In some cases, the memory system 210 may also include one or more pins of a second type (e.g., the pin 117 as described with reference to FIG. 1). The pin of the second type may be unused before the debug operation is initiated. Before a memory management operation is initiated, the memory system 210 may be coupled to the substrate 215 to communicate with the host system 205. The memory system 210 may be also be configured to generate a code during the memory management operation to determine one or more operating conditions. For example, the memory system 210 may generate code during a debug operation. In such examples, the memory system 210 may be configured to couple the resistor 225 with the pin of the second type during the debug operation. During the debug operation, the memory system may be coupled with the circuit 220. Additionally, during the debug operation, the memory system 210 may be configured to generate the code based on a value of the resistor 225 of the circuit 220. The memory system 210 may implement the code to determine an error associated with the memory system 210—e.g., an error associated with the signals communicated between the memory system 210 and the host system 205. The memory system 210 may also implement the code to determine operating conditions like timing parameters.

The substrate 215 may be configured to communicate signals between the memory system 210 and the host system 205. That is, substrate 215 may support and couple the components of the host system 205 with the components of the memory system 210. For example, the substrate 215 may include the channels (e.g., channels 115) that are used to communicate between the memory system 210 and the host system 205. In some examples, the substrate 215 may be a printed circuit board (PCB). The substrate 215 may avoid being coupled with the pin of the second type at the memory system 210.

Circuit 220 may be configured to determine an error associated with the memory system 210. For example, the circuit 220 may determine an error associated with the signals communicated between the host system 205 and the memory system 210—e.g., a timing parameter error. In some examples, the circuit 220 may be configured to adjust the timing parameters associated with the signals communicated. The circuit 220 may be coupled with the substrate 215 through a first plurality of channels (e.g., the channels 115 as described with reference to FIG. 1). The circuit 220 may be coupled with the memory system 210 through a second plurality of channels. A resistor 225 may be coupled with or may be part of the circuit 220.

The resistor 225 may be coupled with the memory system 210 via the pin of the second type. In some examples, the resistor 225 may have a configurable resistive value. That is, the value of resistor 225 may be changed by a user of the memory system 210. The resistor 225 may be implemented to determine the error associated with the memory system 210. That is, changing the value of resistor 225 may cause a different code to be generated at the memory system 210. Thus, adjusting the value of resistor 225 may enable a user of the memory system 210 to determine an error associated with the signals communicated between the memory system 210 and the host system 205. The resistor 225 may be coupled with the memory system 210 via the pin of the second type. In some examples, the resistor 225 may also be coupled to ground—e.g., the resistor 225 may connect the pin of the second type with ground.

In some examples, a user may experience an error in the system 200. For example, there may be an error associated with signals communicated between the host system 205 and the memory system 210. In some examples, to determine the error, a memory system 210 user may implement a test interposer. The test interposer may be coupled with the substrate 215 and the memory system 210. As the memory system 210 increases a speed at which the signals are communicated, the test interposer may cause an impact on the system 200. That is, the test interposer may be unable to measure the signals communicated. Additionally, the distance between the host system 205 and the memory system 210 may cause the signals to be distorted when implementing the test interposer. In some examples, as the memory system 210 may be unable to adjust timing parameters associated with the signals, the user of the memory system may be unable to check the timing or improve the timing of the signals when utilizing the test interposer. In such cases, using a test interposer may not result in identifying a cause of the error in the memory system with high-level of confidence. Without isolating the cause of the error with a higher level of confidence, it may be challenging to implement a correct solution to address the error (e.g., adjusting signaling or operations of the memory device).

As described herein, a circuit 220 may be inserted into the system 200 between the substrate 215 and the memory system 210 to determine an error associated with the memory system 210 during a memory management operation (e.g., a debug operation). For example, the user (e.g., customer) of the memory system 210 may send the system 200 to a memory system 210 manufacturer (or other entity) to determine the error associated with the memory system 210. In some cases, a user of the memory system 210 may implement these features themselves. During the debug operation, the memory system 210 may be uncoupled from the substrate 215. In some examples, after memory system 210 is uncoupled, the circuit 220 may be coupled with the substrate 215 though the first plurality of channels. The memory system 215 may then be coupled with the circuit 220 through the second plurality of channels. Additionally, the resistor 225 of the circuit 220 may be coupled with the pin of the second type at the memory system 210. During the debug operation, a value may be selected for the resistor 225. The memory system 210 may generate a code to determine one or more operating conditions based on the selected value of the resistor 225. The memory system 210 may also implement the code to determine the error associated with the memory system 210—e.g., an error associated with the communication of the signals. For example, the memory system 210 may generate the code to adjust the timing of the signals based on the value of the resistor—e.g., increasing the value of the resistor 225 may cause a timing parameter associated with a signal communicated between the memory system 210 and the host system 205 to increase.

By implementing the circuit 220 during the debug operation, the timing and integrity of the signals communicated between the host system 205 and memory system 210 may be determined. That is, because the resistor 225 is coupled with the pin of the second type, the impact of the circuit 220 on the system 200 may be negligible and avoid distorting the signals communicated. Thus, the debug operation results may be improved and determined more accurately.

Figure 3:
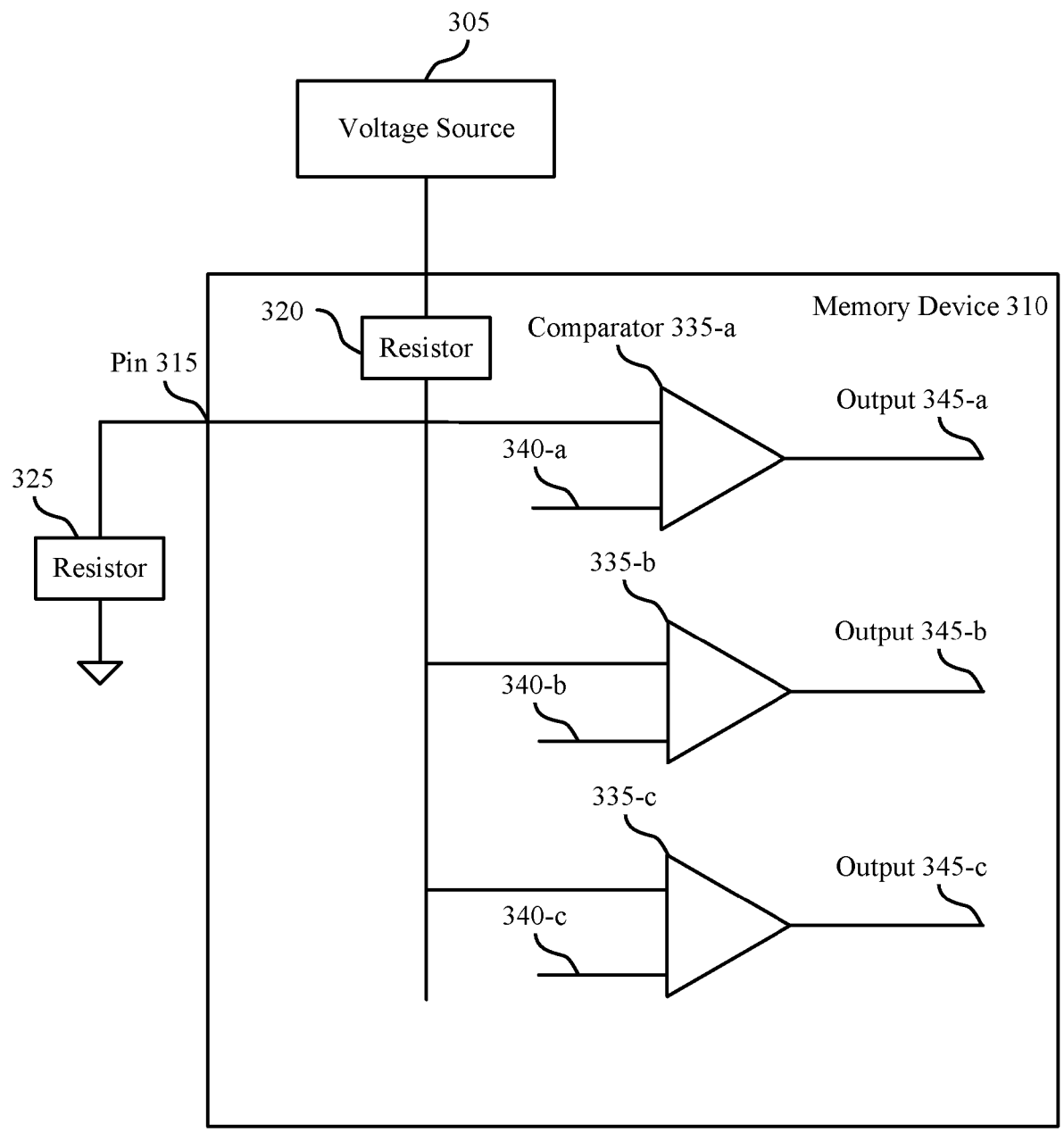
FIG. 3 illustrates an example of a system that supports debug capabilities of a memory system with a pin in accordance with examples as disclosed herein.

FIG. 3 illustrates an example of a system 300 that supports debug capabilities of a memory system with a pin in accordance with examples as disclosed herein. System 300 may include a memory system 310 coupled with a resistor 325 via the pin 315. The memory system 310 may be an example of memory system 110 as described with reference to FIG. 1. Resistor 325 may be an example of resistor 225 as described with reference to FIG. 1. Resistor 325 may be a part of a circuit (e.g., the circuit 220 as described with reference to FIG. 1). Pin 315 may be an example of the pin 117 as described with reference to FIG. 1. System 300 may also include a voltage source 305. The memory system 310 may further include a resistor 320 (e.g., a resistor internal to the memory system 310), comparators 335, and reference voltages 340.

Voltage source 305 may be configured to supply a first voltage to the memory system 310. In some examples, the voltage source 305 may supply a voltage of 1.1 volts to the memory system 310.

Resistor 320 and resistor 325 may be configured as a voltage divider. That is, the resistor 320 and resistor 325 may be configured to receive the first voltage from the voltage source 305 and output a second voltage that is less than the first voltage based on a resistance of each resistor 320 and 325. In some examples, the resistor 325 may be configured to have a variable resistance. That is, the value of resistor 325 may be changed. In such examples, the resistor 320 and 325 may output a variable voltage that depends on the value selected for the resistor 325. Resistor 325 may further be external to the memory system 310 and be configured to couple with the memory system 310 via the pin 315 (e.g., the pin of the second type as described with reference to FIG. 2). The resistor 325 may also couple the pin 315 to ground.

Comparators 335 may be configured to generate code based on receiving the second voltage outputted from the resistor 320 and resistor 325. In some examples, each comparator 335 may also receive a respective reference voltage 340—e.g., comparator 335-*a* may receive reference voltage 340-*a*, comparator 335-*b* may receive reference voltage 340-*b*, and so forth. The comparators 335 may be configured to compare the second voltage with the reference voltage and generate an output 345. For example, comparator 335-*a* may generate an output 345-*a* that is based on whether the second voltage is greater than or less than the reference voltage 340-*a*. In some examples, the collective outputs 345 may represent the code associated with an error determined at the memory system 310. That is, output 345-*a* may be a first bit of the code, output 345-*b* may be a second bit of the code, and so forth. Although three (3) comparators are shown in FIG. 3, in some examples the memory system 310 may have more than three (3) comparators or less than (3) comparators. As a result, the code generated by the memory system 310 may be more than three (3) bits or less than three (3) bits.

In some examples, a user of the memory system 310 may experience an error when the memory system 310 communicate signals with a host system (e.g., a host system 105 as described with reference to FIG. 1) in a system (e.g., system 100 as described with reference to FIG. 1). To determine the error associated with the memory system 310, a memory management operation (e.g., debug operation) may be initiated. The memory system 310 may be coupled with the resistor 325 and the circuit (e.g., as described with reference to FIG. 2). After the memory system 310 is coupled with the resistor 325 via the pin 315, a first value for the resistor 325 may be selected. In some examples, a user may select the value for the resistor 325. In other examples, a memory system controller (e.g., external memory controller 120, device memory controller 155, local memory controller 165 or a combination thereof as described with reference to FIG. 1) may select the value for the resistor. As a result of selecting the first value, the resistor 320 and resistor 325 may receive the first voltage from the voltage source 305 and output a second voltage to the comparators 335. In some examples, each comparator 335 may receive the second voltage and compare it with a respective reference voltage 340 to generate an output 345-*a*. For example, comparator 335-*a* may compare the second voltage with reference voltage 340-*a* to generate output 345-*a*. In some examples, each output 345-*a* may be a single bit and the collective outputs 345 may represent the code. The memory system 310 may implement the code to determine the error associated with the memory system 310 or determine one or more operating conditions of the memory system 310. In one example, the memory system 310 may generate the code to adjust the timing parameters of the signals. For example, in some cases the value of resistor 320 is 1,000 ohms, reference voltage 340-*a* is 400 millivolts (mv), reference voltage 340-*b* is 600 mv, reference voltage 340-*c* is 800 mv and the first voltage is 1.1 volts. In such cases, if the value of the resistor 325 is selected at 500 ohms, the second voltage generated by the resistors 320 and 325 may be 366 mv and the comparators 335 may generate a first code 000. That is, in such cases the second voltage may be less than each reference voltage 340 of the comparators 335 and as a result, each output 345 may be 0. In some examples, the memory system 310 may generate the code 000 to adjust a timing parameter. For example, the code 000 may increase a timing parameter (e.g., tWCK2DQO) by 50 picoseconds (ps).

After generating the first code, the memory system 310 may select a second value for the resistor 325. By selecting a second value, the memory system 310 may generate a second code. In some examples, the second code may be associated with a second error of the memory system 310 (e.g., determining an error associated with a second timing parameter). In some examples, the memory system 310 may generate the second code to further adjust the timing parameter associated with the first code. For example, the memory system 310 may select the second value of resistor 325 to be 1,000 ohms. In such examples, if the quantities for the remaining components are the same as described above, resistors 320 and 325 may generate a third voltage of 550 millivolts and output the third voltage to the comparators 335. The comparators 335 may generate a code '100.' That is, because the third voltage is greater than the reference voltage 340-*a* (e.g., greater than 400 mv), the comparator 335-*a* may generate a one (1). Additionally, the third voltage may be less than the reference voltages 340-*b* and 340-*c* and the comparators 335-*b* and 335-*c* may generate outputs 345-*b* and 345-*c* that are zero (0). The memory system 310 may generate the second code '100' to adjust the timing parameter (e.g., tWCK2DQ0) by 100 ps.

In some examples, the memory system 310 may generate additional codes (e.g., a third code, a fourth code, etc.). The memory system 310 may determine the timing and integrity of the signal communicated between the memory system 310 and the host system based on the timing parameter adjustment. By adjusting the timing parameter several times, the memory system 310 may determine that a timing adjustment may resolve the error associated with the memory system 310. For example, the memory system 310 may determine that when the timing parameter (e.g., tWCK2DQ0) is adjusted by 100 picoseconds, the error associated with the memory system 310 is resolved. The information gathered by generating the codes (e.g., that a timing adjustment may resolve the error) may enable a user of the memory system 310 to resolve the error. In some examples, the user of the memory system 310 may resolve the error by sending the system to a manufacture or vendor of the host system to permanently make the timing adjustment to the timing parameter—e.g., permanently increase the timing parameter (e.g., tWCK2DQ0) by 100 picoseconds. By utilizing the resistor 325 and the circuit, a user of the memory system 310 may be able to determine the error associated with the memory system 310 accurately without causing signal distortion or impacting the system.

Figure 4:
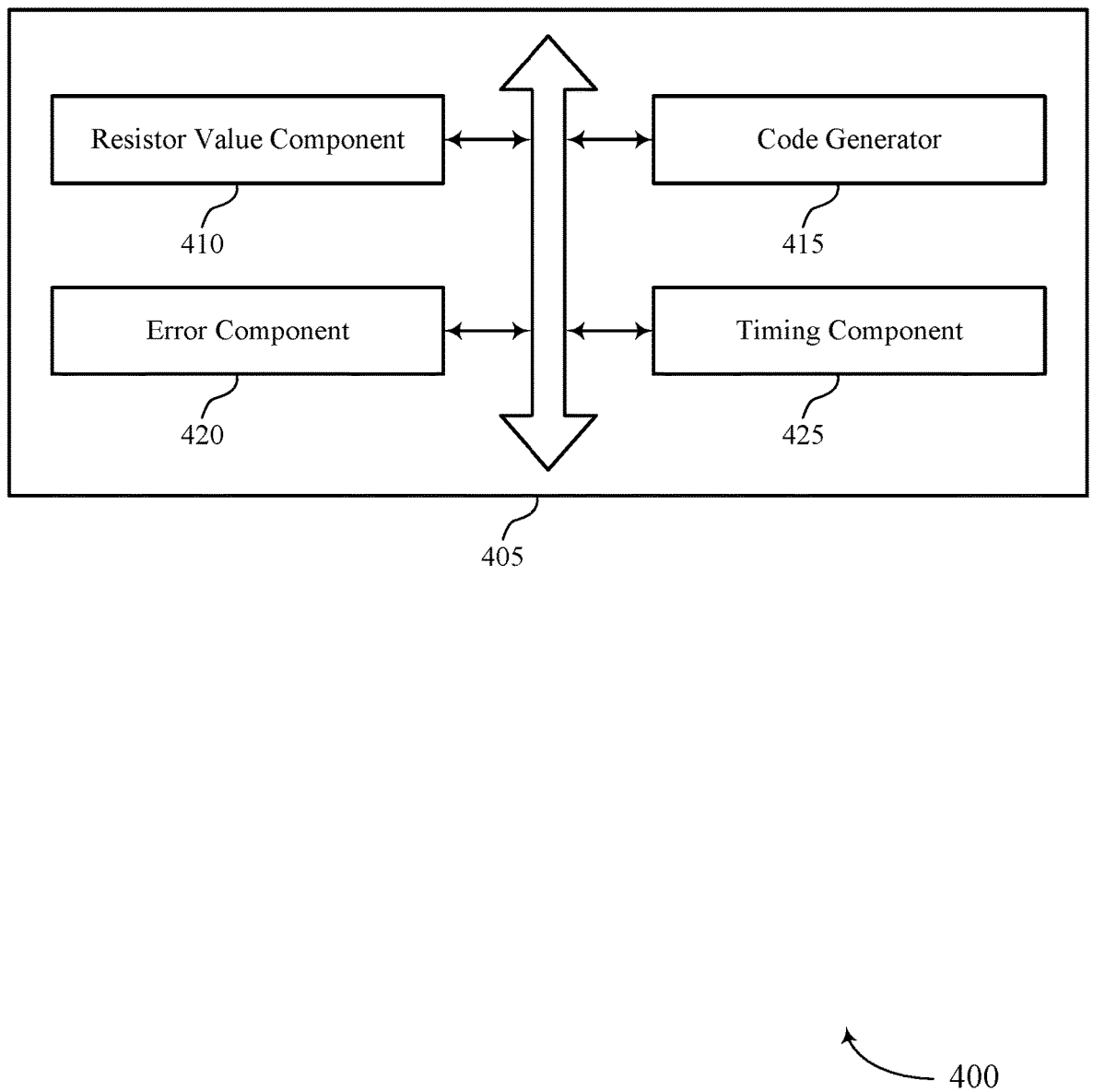
FIG. 4 shows a block diagram of a memory system that supports debug capabilities of a memory system with a pin in accordance with examples as disclosed herein.

FIG. 4 shows a block diagram 400 of a memory system 405 that supports debug capabilities of a memory system with a pin in accordance with examples as disclosed herein. The memory system 405 may be an example of aspects of a memory system as described with reference to FIGS. 1-3. The memory system 405 may include a resistor value component 410, a code generator 415, an error component 420, and a timing component 425. Each of these modules may communicate, directly or indirectly, with one another (e.g., via one or more buses).

The resistor value component 410 may select a value for a resistor on a circuit coupled with the memory system, the memory system including a set of pins of a first type that are for communicating information as part of operating the memory system and a pin of a second type different than the first type, the resistor coupled with the pin of the second type. In some examples, the resistor value component 410 may select a second value for the resistor based on generating the code. In some cases, the resistor value component 410 may select a second value for the resistor. In some instances, the resistor value component 410 may select a second value for the resistor after generating the code.

The code generator 415 may generate, at the memory system, a code as part of a memory management operation to determine one or more operating conditions of the memory system based on the selecting the value for the resistor. In some examples, the code generator 415 may generate a second code to determine the one or more operating conditions of the memory system based on selecting the second value, where determining the error associated with the memory system is based on generating the second code. In some cases, the code generator 415 may generate a second code to determine a second operating condition of the memory system based on selecting the second value.

The error component 420 may determine that an error is associated with the memory system based on the code generated by the memory system and the value of the resistor on the circuit. In some examples, the error component 420 may determine that a second error is associated with the memory system based on the second code generated by the memory system and the second value of the resistor on the circuit.

The timing component 425 may adjust a timing parameter associated with operating the memory system based on determining that the error is associated with the memory system. In some examples, the timing component 425 may adjust the timing parameter a second time based on selecting the second value, where determining the error associated with the memory system is based on adjusting the timing parameter.

Figure 5:
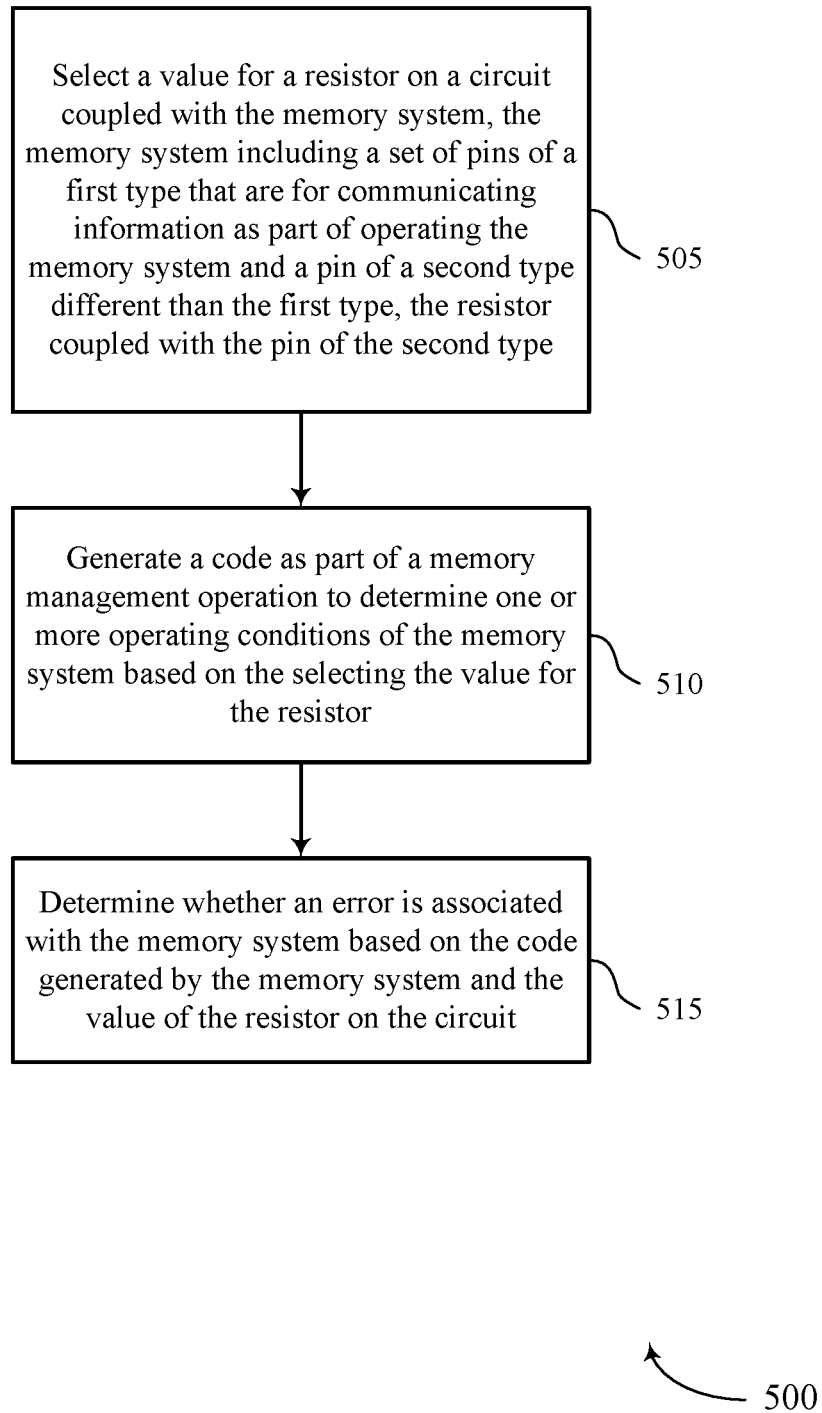
FIG. 5 shows a flowchart illustrating a method or methods that support debug capabilities of a memory system with a pin in accordance with examples as disclosed herein.

FIG. 5 shows a flowchart illustrating a method or methods 500 that supports debug capabilities of a memory system with a pin in accordance with examples as disclosed herein. The operations of method 500 may be implemented by a memory system or its components as described herein. For example, the operations of method 500 may be performed by a memory system as described with reference to FIG. 4. In some examples, a memory system may execute a set of instructions to control the functional elements of the memory system to perform the described functions. Additionally or alternatively, a memory system may perform aspects of the described functions using special-purpose hardware.

At 505, a value for a resistor on a circuit coupled with a memory system may be selected (e.g., by the memory system). The memory system including a set of pins of a first type that are for communicating information as part of operating the memory system and a pin of a second type different than the first type, the resistor coupled with the pin of the second type. The operations of 505 may be performed according to the methods described herein. In some examples, aspects of the operations of 505 may be performed by a resistor value component as described with reference to FIG. 4.

At 510, a code may be generated as part of a memory management operation to determine one or more operating conditions of the memory system based on the selecting the value for the resistor (e.g., by the memory system). The operations of 510 may be performed according to the methods described herein. In some examples, aspects of the operations of 510 may be performed by a code generator as described with reference to FIG. 4.

At 515, it may be determined whether an error is associated with the memory system (e.g., by the memory system) based on the code generated by the memory system and the value of the resistor on the circuit. The operations of 515 may be performed according to the methods described herein. In some examples, aspects of the operations of 515 may be performed by an error component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for selecting a value for a resistor on a circuit coupled with the memory system, the memory system including a set of pins of a first type that are for communicating information as part of operating the memory system and a pin of a second type different than the first type, the resistor coupled with the pin of the second type, generating, at the memory system, a code as part of a memory management operation to determine one or more operating conditions of the memory system based on the selecting the value for the resistor, and determining that an error is associated with the memory system based on the code generated by the memory system and the value of the resistor on the circuit.

Some examples of the method 500 and the apparatus described herein may further include operations, features, means, or instructions for selecting a second value for the resistor based on generating the code, and generating a second code to determine the one or more operating conditions of the memory system based on selecting the second value, where determining the error associated with the memory system may be based on generating the second code.

Some cases of the method 500 and the apparatus described herein may further include operations, features, means, or instructions for selecting a second value for the resistor, generating a second code to determine a second operating condition of the memory system based on selecting the second value, and determining that a second error may be associated with the memory system based on the second code generated by the memory system and the second value of the resistor on the circuit.

Some instances of the method 500 and the apparatus described herein may further include operations, features, means, or instructions for adjusting a timing parameter associated with operating the memory system based on determining that the error may be associated with the memory system.

Some examples of the method 500 and the apparatus described herein may further include operations, features, means, or instructions for selecting a second value for the resistor after generating the code, and adjusting the timing parameter a second time based on selecting the second value, where determining the error associated with the memory system may be based on adjusting the timing parameter.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory system including a set of pins of a first type that are configured to communicate information as part of operating the memory system and a pin of a second type different than the first type, a circuit coupled with the memory system and including a resistor coupled with the pin of the second type, and a controller coupled with the set of pins of the first type, where the controller is configured to cause the apparatus to select a value for the resistor, generate a code as part of a memory management operation to determine one or more operating conditions of the memory system based on selecting the value for the resistor, and determine that an error is associated with the memory system based on the code generated and the value of the resistor on the circuit.

In some examples, the controller may be further configured to select a second value for the resistor based on generating the code, and generate a second code to determine the one or more operating conditions of the memory system based on selecting the second value, where determining the error associated with the memory system may be based on generating the second code.

In some cases, the controller may be further configured to select a second value for the resistor, generate a second code to determine a second operating condition of the memory system based on selecting the second value, and determine that a second error may be associated with the memory system based on the second code generated and the second value of the resistor on the circuit.

In some instances, the controller may be further configured to adjust a timing parameter associated with operating the memory system based on determining that the error may be associated with the memory system.

Some examples of the apparatus may include one or more comparators coupled with a node of the resistor and configured to generate the code based on comparing a voltage associated with the resistor with a respective reference voltage coupled with each comparator of the one or more comparators.

In some instances, the memory system further may include operations, features, means, or instructions for a second resistor coupled with the pin of the second type, where the resistor and the second resistor may be configured as a voltage divider and to receive a first voltage from a voltage source coupled with the pin of the second type and output a second voltage that may be less than the first voltage based on selecting the value of the resistor.

Some cases of the apparatus may include one or more comparators coupled with the output of the voltage divider and configured to receive the second voltage, each comparator of the one or more comparators coupled with a respective reference voltage, and where the one or more comparators may be further configured to generate the code based on comparing the second voltage with the respective reference voltage at each comparator of the one or more comparators.

An apparatus is described. The apparatus may include a substrate, a memory system including a set of pins of a first type that are configured to communicate information as part of operating the memory system and a pin of a second type different than the first type, and a circuit coupled with the substrate and the memory system and configured to determine an error associated with the memory system using the pin of the second type, the circuit including a resistor coupled with the pin of the second type.

In some examples, the memory system further may include operations, features, means, or instructions for a second resistor coupled with the pin of the second type, where the resistor and the second resistor may be configured to receive a first voltage and output a second voltage that may be less than the first voltage.

In some instances, the memory system further may include operations, features, means, or instructions for a voltage source coupled with the pin of the second type and the second resistor configured to output the first voltage.

In some cases, the memory system further may include operations, features, means, or instructions for one or more comparators coupled with the pin of the second type and a second resistor, where each comparator of the one or more comparators may be further coupled with a respective reference voltage, and where each comparator of the one or more comparators may be configured to compare a first voltage with the respective reference voltage.

In some examples, the one or more comparators may be further configured to output a code as part of a memory management operation to determine one or more operating conditions of the memory system based on comparing the first voltage with the respective reference voltage, where determining the error associated with the memory system may be based on outputting the code.

In some instances, the one or more comparators may be further configured to adjust a timing parameter associated with the information communicated via the pin the of the first type based on comparing the first voltage with the respective reference voltage.

In some cases, the circuit may be coupled with the substrate through a first set of channels.

In some examples, the circuit may be coupled with the memory system through a second set of channels.

Some instances of the apparatus may include a host system coupled with the substrate, where the host system may be configured to communicate signals with the memory system as part of operating the memory system.

In some cases, the memory system includes memory cells that include capacitive storage element, resistive storage elements, polarization storage elements, other types of storage elements, or a combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a memory system comprising a plurality of pins of a first type that are configured to communicate information as part of operating the memory system and a pin of a second type different than the first type,
    a circuit coupled with the memory system and comprising a resistor coupled with the pin of the second type, and
    a controller coupled with the plurality of pins of the first type, wherein the controller is configured to cause the apparatus to:
        select a value for the resistor;
        generate a code as part of a memory management operation to determine one or more operating conditions of the memory system based at least in part on selecting the value for the resistor; and determine whether an error is associated with the memory system based at least in part on the code generated and the value of the resistor on the circuit.

2. The apparatus of claim 1, wherein the controller is further configured to cause the apparatus to:
select a second value for the resistor based at least in part on generating the code; and
generate a second code to determine the one or more operating conditions of the memory system based at least in part on selecting the second value, wherein determining the error associated with the memory system is based at least in part on generating the second code.

3. The apparatus of claim 1, wherein the controller is further configured to cause the apparatus to:
select a second value for the resistor;
generate a second code to determine a second operating condition of the memory system based at least in part on selecting the second value; and
determine that a second error is associated with the memory system based at least in part on the second code generated and the second value of the resistor on the circuit.

4. The apparatus of claim 1, wherein the controller is further configured to cause the apparatus to:
adjust a timing parameter associated with operating the memory system based at least in part on determining that the error is associated with the memory system.

5. The apparatus of claim 1, further comprising:
one or more comparators coupled with a node of the resistor and configured to generate the code based at least in part on comparing a voltage associated with the resistor with a respective reference voltage coupled with each comparator of the one or more comparators.

6. The apparatus of claim 1, wherein the memory system further comprises a second resistor coupled with the pin of the second type, wherein the resistor and the second resistor are configured as a voltage divider and to receive a first voltage from a voltage source coupled with the pin of the second type and output a second voltage that is less than the first voltage based at least in part on selecting the value of the resistor.

7. The apparatus of claim 6, further comprising:
one or more comparators coupled with an output of the voltage divider and configured to receive the second voltage, each comparator of the one or more comparators coupled with a respective reference voltage, and wherein the one or more comparators is further configured to generate the code based at least in part on comparing the second voltage with the respective reference voltage at each comparator of the one or more comparators.

8. An apparatus, comprising:
a substrate;
a memory system comprising a plurality of pins of a first type that are configured to communicate information as part of operating the memory system and a pin of a second type different than the first type; and
a circuit coupled with the substrate and the memory system and configured to determine an error associated with the memory system using the pin of the second type, the circuit comprising a resistor coupled with the pin of the second type.

9. The apparatus of claim 8, wherein the memory system further comprises a second resistor coupled with the pin of the second type, wherein the resistor and the second resistor are configured to receive a first voltage and output a second voltage that is less than the first voltage.

10. The apparatus of claim 9, wherein the memory system further comprises a voltage source coupled with the pin of the second type and the second resistor configured to output the first voltage.

11. The apparatus of claim 8, wherein the memory system further comprises one or more comparators coupled with the pin of the second type and a second resistor, wherein each comparator of the one or more comparators is further coupled with a respective reference voltage, and wherein each comparator of the one or more comparators is configured to compare a first voltage with the respective reference voltage.

12. The apparatus of claim 11, wherein the one or more comparators are further configured to output a code as part of a memory management operation to determine one or more operating conditions of the memory system based at least in part on comparing the first voltage with the respective reference voltage, wherein determining the error associated with the memory system is based at least in part on outputting the code.

13. The apparatus of claim 11, wherein the one or more comparators are further configured to adjust a timing parameter associated with the information communicated via the pin of the first type based at least in part on comparing the first voltage with the respective reference voltage.

14. The apparatus of claim 8, wherein the circuit is coupled with the substrate through a first plurality of channels.

15. The apparatus of claim 14, wherein the circuit is coupled with the memory system through a second plurality of channel.

16. The apparatus of claim 8, further comprising:
a host system coupled with the substrate, wherein the host system is configured to communicate signals with the memory system as part of operating the memory system.

17. The apparatus of claim 8, wherein the memory system comprises memory cells that comprise capacitive storage element, resistive storage elements, polarization storage elements, other types of storage elements, or a combination thereof.

18. A method performed by a memory system, comprising:
selecting a value for a resistor on a circuit coupled with the memory system, the memory system comprising a plurality of pins of a first type that are for communicating information as part of operating the memory system and a pin of a second type different than the first type, the resistor coupled with the pin of the second type;
generating, at the memory system, a code as part of a memory management operation to determine one or more operating conditions of the memory system based at least in part on selecting the value for the resistor; and
determining whether an error is associated with the memory system based at least in part on the code generated by the memory system and the value of the resistor on the circuit.

19. The method of claim 18, further comprising:
selecting a second value for the resistor based at least in part on generating the code; and
generating a second code to determine the one or more operating conditions of the memory system based at least in part on selecting the second value, wherein determining the error associated with the memory system is based at least in part on generating the second code.

20. The method of claim 18, further comprising:
selecting a second value for the resistor;
generating a second code to determine a second operating condition of the memory system based at least in part on selecting the second value; and
determining that a second error is associated with the memory system based at least in part on the second code generated by the memory system and the second value of the resistor on the circuit.

21. The method of claim 18, further comprising:
adjusting a timing parameter associated with operating the memory system based at least in part on determining that the error is associated with the memory system.

22. The method of claim 21, further comprising:
selecting a second value for the resistor after generating the code; and
adjusting the timing parameter a second time based at least in part on selecting the second value, wherein determining the error associated with the memory system is based at least in part on adjusting the timing parameter.

23. A non-transitory computer-readable medium storing code comprising instructions, which when executed by a processor of an electronic device, cause the electronic device to:
select a value for a resistor on a circuit coupled with a memory system, the memory system comprising a plurality of pins of a first type that are for communicating information as part of operating the memory system and a pin of a second type different than the first type, the resistor coupled with the pin of the second type;
generate, at the memory system, a code as part of a memory management operation to determine one or more operating conditions of the memory system based at least in part on the selecting the value for the resistor; and
determine whether an error is associated with the memory system based at least in part on the code generated by the memory system and the value of the resistor on the circuit.

24. The non-transitory computer-readable medium of claim 23, wherein the instructions, when executed by the processor the electronic device, further cause the electronic device to:
select a second value for the resistor based at least in part on generating the code; and
generate a second code to determine the one or more operating conditions of the memory system based at least in part on selecting the second value, wherein determining the error associated with the memory system is based at least in part on generating the second code.

25. The non-transitory computer-readable medium of claim 23, wherein the instructions, when executed by the processor the electronic device, further cause the electronic device to:
select a second value for the resistor;
generate a second code to determine a second operating condition of the memory system based at least in part on selecting the second value; and
determine that a second error is associated with the memory system based at least in part on the second code generated by the memory system and the second value of the resistor on the circuit.

* * * * *